United States Patent
Nakatani

(10) Patent No.: US 7,773,491 B2
(45) Date of Patent: Aug. 10, 2010

(54) METHOD AND APPARATUS FOR HIGH-SPEED OPTICAL DISC RECORDING USING MULTI CHIP MODULE

(75) Inventor: Yasukazu Nakatani, Hyogo-ken (JP)

(73) Assignee: Ricoh Company, Ltd., Tokyo (JP)

( * ) Notice: Subject to any disclaimer, the term of this patent is extended or adjusted under 35 U.S.C. 154(b) by 1630 days.

(21) Appl. No.: 11/019,923

(22) Filed: Dec. 22, 2004

(65) Prior Publication Data

US 2005/0141395 A1 Jun. 30, 2005

(30) Foreign Application Priority Data

Dec. 24, 2003 (JP) .............................. 2003-426256

(51) Int. Cl.
*G11B 7/00* (2006.01)

(52) U.S. Cl. ....................... 369/116; 369/120

(58) Field of Classification Search ................. 369/120, 369/121, 116, 122, 47.5
See application file for complete search history.

(56) References Cited

U.S. PATENT DOCUMENTS 6,888,395 B2 * 5/2005 Mizuno et al. ............... 327/333

FOREIGN PATENT DOCUMENTS

| JP | 11-85345 | 3/1999 |
|---|---|---|
| JP | 11-86546 | 3/1999 |
| JP | 2000-216470 | 8/2000 |
| JP | 2003-132571 | 5/2003 |

OTHER PUBLICATIONS

Sep. 15, 2009 Japanese official action in connection with a counterpart Japanese patent application No. 2003-426256.

* cited by examiner

*Primary Examiner*—Nabil Z Hindi
(74) *Attorney, Agent, or Firm*—Cooper & Dunham LLP

(57) ABSTRACT

An optical disc recording apparatus records external data on an optical disc by using a semiconductor laser. The optical disc recording apparatus includes a circuit board. The circuit board is mounted with a power supply source and an MCM (multi chip module). The power supply source outputs at least one power voltage including a first voltage, and the MCM receives the at least one power voltage including the first voltage output from the power supply source. The MCM includes a first circuit and a second circuit. The first circuit includes at least one power supply circuit which generates at least one power voltage including a second voltage. The second circuit receives the at least one power voltage including the second voltage output from the at least one power supply circuit of the first circuit. An optical disc recording method is also described.

55 Claims, 8 Drawing Sheets

METHOD AND APPARATUS FOR HIGH-SPEED OPTICAL DISC RECORDING USING MULTI CHIP MODULE

BACKGROUND

1. Field

This patent specification relates to a method and apparatus for optical disc recording, and more particularly to a method and apparatus for high-speed optical disc recording using an MCM (multi chip module).

2. Discussion of the Background

Currently, various types of information (for example, not only general computer information but also information of sounds, still images, moving images, and the like) are digitalized. As a result, the amount of information processed by computer is increased. As a medium for recording the variety of information, an optical disc such as a DVD+RW/+R is widely used.

Data is written on the optical disc by applying a laser beam thereto and forming a recording pit thereon. When the data is written on the optical disc, a drive current based on a write pulse having a predetermined pulse width is applied to a semiconductor laser of an optical pickup. The semiconductor laser then applies a laser beam to a recording surface of the optical disc rotating at a predetermined speed.

FIG. 1 is a block diagram illustrating a common system configuration of an optical disc recording apparatus for writing data on the optical disc. In the optical disc recording apparatus 100 of FIG. 1, an optical disc 101 is a recordable disc such as a DVD+RW/+R and a CD-R. A spindle motor 102 rotates the optical disc 101. A disc controller 103 controls driving of the spindle motor 102 according to a CLV (constant linear velocity) method, wherein a rotation speed of the optical disc 101 becomes inversely proportional to a radius of a track of the optical disc 101. That is, in recording data on and reproducing data from the optical disc 101, a linear velocity is controlled to be constant at any radial position of the track. Accordingly, the spindle motor 102 drives to rotate the optical disc 101 at a constant speed. Further, the disc controller 103 controls the driving of the spindle motor 102 such that the spindle motor 102 controls the rotation of the optical disc 101 by a PLL (phase locked loop) method, wherein the optical disc 101 is rotated at a predetermined speed, for example, a normal speed, a 2×-speed (i.e., two-time speed), a 4×-speed, an 8×-speed, a 12×-speed, and so forth.

An optical pickup 104 includes a semiconductor laser, an optical system, a photo-detector, and so forth (not shown) for focusing and applying a laser beam to the optical disc 101 to perform data recording or data reproduction. In data recording, the optical system focuses the laser beam emitted from the semiconductor laser and applies a beam spot to a recording surface of the optical disc 101, so that a recording pit is formed on the recording surface. In data reproduction, the recording surface is applied with a laser beam having a lower power than a power used in the data recording. Then, a light reflected from the recording surface is focused by the optical system, subjected to an optical-to-electrical conversion at the photo-detector, and output from the optical pickup 104 in a form of a reproduced signal.

An encoder 105 performs predetermined data processing such as interleaving and error check coding on data to be recorded on the optical disc 101, and modulates the data by EFM (eight-to-fourteen) modulation or ESM (eight-to-sixteen) modulation to generate a modulated signal for the data recording. The encoder 105 then sends the modulated signal to a strategy generation circuit 106. The strategy generation circuit 106 generates a write pulse having a predetermined pulse length in consideration of a write strategy parameter, and sends the generated write pulse to an LD (laser diode) driver 107. The LD driver 107 then generates a drive current for driving the semiconductor laser of the optical pickup 104, based on the write pulse received from the strategy generation circuit 106. As a result, the optical pickup 104 applies the laser beam to the optical disc 101 with a predetermined power according to the write pulse.

A servo controller 108 controls focusing and tracking of the laser beam emitted from the semiconductor laser of the optical pickup 104. The servo controller 108 performs the tracking control by detecting a pregroove formed on the recording surface of the optical disc 101. A R/F (radio frequency) circuit 109 performs a predetermined operation on a waveform of the reproduced signal transmitted from the optical pickup 104, and generates an FE (focusing error) signal indicating a deviation of the beam spot from the recording surface and a TE (tracking error) signal indicating a deviation of the beam spot from a predetermined track. The generated FE signal and TE signal are used at the servo controller 108 for controlling the focusing and tracking of the laser beam. The R/F circuit 109 further performs a predetermined operation on the waveform of the reproduced signal transmitted from the optical pickup 104 and binarizes a resultant signal to generate an R/F signal. A decoder 110 demodulates the R/F signal by EFM demodulation or ESM demodulation to generate demodulated data, and performs data processing such as error correction and deinterleaving. An ATIP (absolute time in pregroove) decoder 111 demodulates the TE signal transmitted from the R/F circuit 109 to generate a wobble signal. At the ATIP decoder 111, noise components are eliminated from the TE signal by a band-pass filter (not shown), and the TE signal is digitalized by a binarization circuit (not shown) and demodulated by an FSK (frequency shift keying) demodulation circuit (not shown), so that the wobble signal is generated. The disc controller 103 controls the rotation of the optical disc 101 such that the wobble signal takes a predetermined value.

The demodulated wobble signal contains CRC (cyclic redundancy check) data to be used for error checking. The CRC data is checked to find if data has been correctly read out. Data of a wobble signal read error ratio (hereinafter referred to as ATER (ATIP error rate)) is stored in a resistor provided in the ATIP decoder 111 during a data reproduction operation and updated every predetermined time period.

A system controller 112 including a CPU (central processing unit) reads the data of the error ratio stored in the register to monitor the ATER during a data recording operation. The system controller 112 forms, together with the ATIP decoder 111, main parts of a wobble signal read error measuring unit that measures the ATER during the data recording operation. The system controller 112 controls, in accordance with a command transmitted from an external apparatus such as a personal computer, respective circuit blocks of the disc controller 103, the encoder 105, the strategy generation circuit 106, the LD driver 107, the servo controller 108, the R/F circuit 109, and so forth, such that data is recorded on or reproduced from a predetermined sector of the optical disc 101. A host I/F (interface) 113 is an interface for communicating the optical recording apparatus 100 with a host machine such as a personal computer so that commands and data are transmitted between the optical recording apparatus 100 and the host machine.

The data to be recorded on the optical disc 101 is input from the external apparatus in the encoder 105 via the host I/F 113. As described above, the data thus input is subjected to the predetermined processing such as the interleaving and the error check coding and then to the EFM modulation or the ESM modulation, so that the write pulse having the predetermined pulse length in consideration of the write strategy parameter is generated by the strategy generation circuit 106. During the data recording operation, the ATER is checked at regular time intervals. If it is detected that the ATER has exceeded a predetermined value, a width of the write pulse is reduced to be a slightly shorter than a write pulse width usually used. Further, to obtain an original pit length, a write power is increased immediately before falling of the write pulse to compensate for the reduced width of the write pulse. The write pulse is then input in the LD driver 107 to generate a drive current according to a length of the pit to be formed on the recording surface of the optical disc 101. The drive current is input in the optical pickup 104 to drive the semiconductor laser, and the laser beam emitted from the semiconductor laser is focused by the optical system to form the beam spot on the recording surface of the optical disc 101 rotating at the constant speed. Accordingly, a pit having a predetermined length is formed on the recording surface.

As illustrated in FIG. 2, LSIs (large-scale integrations) forming circuit blocks of the optical disc recording apparatus 100 are mounted on printed circuit boards, i.e., a main circuit board 120 for controlling the system of the optical disc recording apparatus 100, and a pickup board 130 connected to the main circuit board 120 by a flexible cable 140. The main circuit board 120 is mounted with a control LSI 121 for forming the above circuit blocks forming the system of the optical disc recording apparatus 100 shown in FIG. 1, i.e., the disc controller 103, the encoder 105, the strategy generation circuit 106, the servo controller 108, the R/F circuit 109, the decoder 110, the ATIP decoder 111, the system controller 112, and so forth. The LSIs for forming the circuit blocks are formed by a plurality of chips but denoted by the control LSI 121 as one circuit block in FIG. 2. The pickup board 130 is reduced in size so as to move integrally with the optical pickup 104, and is mounted with an LD driver chip 131 forming the LD driver 107.

PS (power supply) LSIs 122, 123, and 124 for supplying power voltages are mounted on the main circuit board 120 to reduce the size of the pickup board 130 as much as possible. In FIG. 2, the three PS LSIs 122, 123, and 124 are used for different purposes, for example, for supplying a voltage of 5 V to drive the semiconductor laser, a voltage of 3.3 V to be used for the host I/F 113 communicating the optical disc recording apparatus 100 with an external apparatus, and a voltage of 1.8 V to perform digital processing in the optical disc recording apparatus 100.

A speed of recording data on the optical disc has been increased from the normal speed to a 2×-speed, a 4×-speed, an 8×-speed, and so forth. In fact, the applicant of the present patent application has already been marketing an optical disc recording apparatus performing 2.4×-speed data recording on a DVD+RW/+R and 12×-speed data recording on a CD-R (e.g., a product sold under the trademark MP5125A).

In this circumstance, there is an increasing demand for an optical disc recording apparatus capable of recording data on the optical disc at a further faster recording speed. For example, there is a demand for a faster data recording speed on a DVD, such as a 16×-speed and a 32×-speed. To increase the data recording speed, a speed of signal processing such as strategy generation should be increased. The conventional optical disc recording apparatus configured to transmit signals obtained through the strategy generation to the pickup board via the flexible cable, however, has a limitation in increasing a signal transmission speed due to such influences as noise. It is therefore difficult to increase the data recording speed on the DVD.

To address the above, a digital signal arithmetic LSI and an LD driver LSI, which form the strategy generation circuit, may be integrated and mounted on the pickup board. The digital signal arithmetic LSI and the LD driver LSI can be integrated by a technique of MCM, wherein a plurality of LSIs are incorporated in one package. The MCM has an advantage that the plurality of LSIs forming different circuits such as a memory circuit, a logic circuit, and an analog circuit are integrated in one package to provide a high-performance, multi-functional system device.

The above-described strategy generation circuit is a digital signal arithmetic circuit, and the LD driver is an analog signal arithmetic circuit. An LSI forming the strategy generation circuit and an LSI forming the LD driver can be integrated by using the MCM technique. Since the strategy generation circuit should perform a high-speed operation, it is preferable that the strategy generation circuit is highly integrated and driven at a relatively low voltage. Conversely, the LD driver should be driven at a relatively high voltage for driving the semiconductor laser, for example, at 5 V.

As described above, the conventional pickup board 130 is not mounted with any PS LSI, and therefore a predetermined power voltage is supplied via the flexible cable 140 from the main circuit board 120 to an individual circuit mounted on the pickup board 130.

In the configuration of the conventional optical disc recording apparatus 100, however, if the LSI forming the digital signal arithmetic circuit and the LSI forming the LD driver are integrated to form the strategy generation circuit and mounted on the pickup board 130 to receive predetermined power voltages via the flexible cable 140, the following disadvantage is caused, impeding increase in the signal processing speed.

That is, in the conventional configuration supplying the predetermined power voltages via the flexible cable 140 to the respective LSIs mounted on the pickup board 130, an unintended impedance is generated in a PS (power supply) LSI due to parasitic inductance (L) and capacitance (C) caused by wiring of the printed circuit boards or the flexible cable 140. When a current consumed by the LSI, i.e., a load of the PS LSI receiving power from the PS LSI is changed over time due to the impedance, an output power characteristic of the PS LSI, as well as a load change characteristic specific to the PS LSI, may be deteriorated.

The impedance of the power output from the PS LSI refers to, in this example, a characteristic impedance of the wiring of the PS LSI. Generally, the characteristic impedance is expressed as in the formula of $Z=(L/C)^{1/2}$. It is determined from the formula that the impedance can be decreased by increasing the capacitance or by decreasing the inductance. The capacitance can be increased by inserting a bypass capacitor between a ground terminal GND and a power supply terminal of the LSI serving as a load, or by increasing a width of the wiring line. The inductance may also be decreased by increasing the width of the wiring line. Increase in the width of the wiring line, however, leads to increase in area of the printed circuit board, which is not acceptable from a viewpoint of downsizing of the printed circuit board. Therefore, the output power characteristic is conventionally improved by inserting a variety of filters in a power supply line. In an optical disc recording apparatus operating at an increasingly faster speed, however, this technique of inserting the filters does not satisfactorily work for effectively driving the write strategy circuit and the LD circuit.

Further, as the operational speed of the optical disc recording apparatus with respect to the DVD increases, density of data recorded on and reproduced from the DVD is increased. As a result, the speed and accuracy of a signal processed by an LD driver chip continues to be improved. Particularly, the accuracy in time of a recording signal becomes an important factor for increasing the data writing speed on the DVD. The accuracy in time of the recording signal is determined by oscillation accuracy of a PLL (phase-locked loop) circuit, which is included in the digital signal arithmetic LSI of the strategy generation circuit, and which generates a reference clock signal for a modulated signal used for the data recording on the DVD. A jitter of the PLL circuit should be reduced to improve data writing accuracy and the data writing speed.

The jitter of the PLL circuit includes a random jitter caused by such factors as a thermal noise and a deterministic jitter having a specific frequency component. The random jitter largely depends on a process of manufacturing the circuit, and thus it is difficult to reduce the random jitter by modifying a configuration of the PLL circuit. Conversely, the deterministic jitter often occurs when a noise having a specific frequency is superposed on power supply lines (VCC) and ground lines (GND) provided in a circuit board. The noise superposed on the power supply lines (VCC) and the ground lines (GND) is triggered by the above-described impedance occurring in the wiring of the PS LSI and by operation of the load circuit.

As described above, to increase the data recording speed on the DVD, the oscillation accuracy of the PLL circuit included in the digital signal arithmetic LSI should be improved.

SUMMARY

This patent specification describes a novel optical disc recording apparatus for recording external data on an optical disc by using a semiconductor laser. In one example, a novel optical disc recording apparatus includes a circuit board, a power supply source, and a multi chip module. The power supply source is configured to be mounted on the circuit board to output at least one power voltage including a first voltage. The multi chip module is configured to be mounted on the circuit board to receive the at least one power voltage including the first voltage output from the power supply source. The multi chip module includes a first circuit and a second circuit. The first circuit is configured to include at least one power supply circuit configured to generate at least one power voltage including a second voltage. The second circuit is configured to receive the at least one power voltage including the second voltage output from the at least one power supply circuit of the first circuit.

The second voltage may be lower than the first voltage, and the first circuit may be driven by the first voltage and the second circuit may be driven by the second voltage.

The second circuit may perform a digital signal arithmetic operation based on the external data encoded in a predetermined manner to generate a plurality of strategy signals through a strategy generation process based on the encoded external data. The first circuit may control driving of the semiconductor laser to emit a laser beam to the optical disc based on the plurality of strategy signals.

The second circuit may include a phase locked loop circuit configured to receive the second voltage output from the at least one power supply circuit of the first circuit.

The first and second circuits may be formed by separate semiconductor chips.

The first circuit may include a first interface circuit, and the second circuit may include a second interface circuit. The second interface circuit may convert the plurality of strategy signals to a plurality of low voltage differential signals to transmit the plurality of low voltage differential signals to the first interface circuit. The first interface circuit may reconvert the plurality of low voltage differential signals to the plurality of strategy signals.

The first interface circuit may include connection pads, and the second interface circuit may include respectively corresponding connection pads. The connection pads in the first interface circuit may be connected to the respectively corresponding connection pads in the second interface circuit at a substantially equal distance through bonding wires of a substantially equal length to transmit the plurality of low voltage differential signals from the second interface circuit to the first interface circuit.

The at least one power voltage including the first voltage output from the power supply source may also include a third voltage, so that the first voltage may be about 5 volts, the second voltage may be about 3.3 volts, and the third voltage may be about 1.8 volts.

The at least one power voltage including the second voltage output from the at least one power supply circuit of the first circuit may also include a third voltage, so that the first voltage may be about 5 volts, the second voltage may be about 3.3 volts, and the third voltage may be about 1.8 volts.

The optical disc recording apparatus may further include another circuit board and a signal cable. The another circuit board may include a control circuit configured to control operations of the optical disc recording apparatus. The signal cable may be configured to interface the control circuit with the multi chip module.

This patent specification further describes a novel optical disc recording method of recording external data on an optical disc by using a semiconductor laser. In one example, this optical disc recording method includes providing a circuit board, mounting on the circuit board a power supply source configured to output at least one power voltage including a first voltage, placing on the circuit board a multi chip module integrating a first circuit with a second circuit, causing the second circuit to perform a digital signal arithmetic operation based on the external data encoded in a predetermined manner to generate a plurality of strategy signals through a strategy generation process based on the encoded external data, and causing the first circuit to control driving of the semiconductor laser based on the plurality of strategy signals to emit a laser beam and record the external data on the optical disc. The first circuit is configured to receive the first voltage and separately generate at least one power voltage including a second voltage. The second circuit is configured to receive the at least one power voltage including the second voltage.

The method may further include driving the first circuit by the first voltage, and driving the second circuit by the second voltage which is lower than the first voltage.

The method may further include causing the second circuit to perform a phase locked loop operation based on the second voltage.

The first and second circuits may be formed by separate semiconductor chips.

The method may further include causing the second circuit to convert the plurality of strategy signals to a plurality of low voltage differential signals, transmitting the plurality of low voltage differential signals from the second circuit to the first circuit, and causing the first circuit to reconvert the plurality of low voltage differential signals to the plurality of strategy signals.

The first circuit may be formed by a first semiconductor chip, and the second circuit may be formed by a second semiconductor chip. The first semiconductor chip may include connection pads, and the second semiconductor chip may include respectively corresponding connection pads. The connection pads in the first semiconductor chip may be connected to the respectively corresponding connection pads in the second semiconductor chip at a substantially equal distance through bonding wires of a substantially equal length to transmit the plurality of low voltage differential signals from the second semiconductor chip to the first semiconductor chip.

The at least one power voltage including the first voltage output from the power supply source may also include a third voltage, so that the first voltage may be about 5 volts, the second voltage may be about 3.3 volts, and the third voltage may be about 1.8 volts.

The at least one power voltage including the second voltage output from the first circuit may also include a third voltage, so that the first voltage may be about 5 volts, the second voltage may be about 3.3 volts, and the third voltage may be about 1.8 volts.

The method may further include providing another circuit board, mounting on the another circuit board a control circuit configured to control operations of the optical disc recording apparatus, and interfacing the control circuit with the multi chip module through a signal cable.

This patent specification further describes a novel multi chip module for an optical disc recording apparatus recording external data on an optical disc by using a semiconductor laser. In one example, the novel multi chip module includes a first circuit and a second circuit. The first circuit is configured to receive a first voltage included in at least one power voltage output from an external power supply source and include at least one power supply circuit configured to generate at least one power voltage including a second voltage which is lower than the first voltage. The second circuit is configured to receive the at least one power voltage including the second voltage output from the at least one power supply circuit of the first circuit. The first circuit is driven by the first voltage, and the second circuit is driven by the second voltage.

The second circuit may perform a digital signal arithmetic operation based on the external data encoded in a predetermined manner to generate a plurality of strategy signals through a strategy generation process based on the encoded external data. The first circuit may control driving of the semiconductor laser to emit a laser beam to the optical disc based on the plurality of strategy signals.

The second circuit may include a phase locked loop circuit configured to receive the second voltage output from the at least one power supply circuit of the first circuit.

The first and second circuits may be formed by separate semiconductor chips.

The first circuit may include a first interface circuit, and the second circuit may include a second interface circuit. The second interface circuit may convert the plurality of strategy signals to a plurality of low voltage differential signals to transmit the plurality of low voltage differential signals to the first interface circuit, and the first interface circuit may reconvert the plurality of low voltage differential signals to the plurality of strategy signals.

The first circuit may be formed by a first semiconductor chip, and the second circuit may be formed by a second semiconductor chip. The first semiconductor chip may include connection pads, and the second semiconductor chip may include respectively corresponding connection pads. The connection pads in the first semiconductor chip may be connected to the respectively corresponding connection pads in the second semiconductor chip at a substantially equal distance through bonding wires of a substantially equal length to transmit the plurality of low voltage differential signals from the second semiconductor chip to the first semiconductor chip.

The at least one power voltage including the first voltage output from the external power supply source may also include a third voltage, so that the first voltage may be about 5 volts, the second voltage may be about 3.3 volts, and the third voltage may be about 1.8 volts.

The at least one power voltage including the second voltage output from the at least one power supply circuit of the first circuit may also include a third voltage, so that the first voltage may be about 5 volts, the second voltage may be about 3.3 volts, and the third voltage may be about 1.8 volts.

The multi chip module may receive the external data through a signal cable from a control circuit of the optical disc recording apparatus.

This patent specification further describes a novel method of controlling driving of a semiconductor laser used in an optical disc recording apparatus recording external data on an optical disc. In one example, the novel method includes providing a multi chip module including a first circuit configured to receive a first voltage included in at least one power voltage output from an external power supply source and separately generate at least one power voltage including a second voltage which is lower than the first voltage, and a second circuit configured to receive the at least one power voltage including the second voltage output from the first circuit; driving the first circuit by the first voltage; and driving the second circuit by the second voltage.

The method may further include causing the second circuit to perform a digital signal arithmetic operation based on the external data encoded in a predetermined manner to generate a plurality of strategy signals through a strategy generation process based on the encoded external data, and causing the first circuit to control driving of the semiconductor laser to emit a laser beam to the optical disc based on the plurality of strategy signals.

The method may further include causing the second circuit to perform a phase locked loop operation based on the second voltage.

The first and second circuits may be formed by separate semiconductor chips.

The method may further include causing the second circuit to convert the plurality of strategy signals to a plurality of low voltage differential signals, transmitting the plurality of low voltage differential signals from the second circuit to the first circuit, and causing the first circuit to reconvert the plurality of low voltage differential signals to the plurality of strategy signals.

The first circuit may be formed by a first semiconductor chip, and the second circuit may be formed by a second semiconductor chip. The first semiconductor chip may include connection pads, and the second semiconductor chip may include respectively corresponding connection pads. The connection pads in the first semiconductor chip may be connected to the respectively corresponding connection pads in the second semiconductor chip at a substantially equal distance through bonding wires of a substantially equal length to transmit the plurality of low voltage differential signals from the second semiconductor chip to the first semiconductor chip.

The at least one power voltage including the first voltage output from the external power supply source may also include a third voltage, so that the first voltage may be about 5 volts, the second voltage may be about 3.3 volts, and the third voltage may be about 1.8 volts.

The at least one power voltage including the second voltage output from the first circuit may also include a third voltage, so that the first voltage may be about 5 volts, the second voltage may be about 3.3 volts, and the third voltage may be about 1.8 volts.

The method may further include interfacing, through a signal cable, the multi chip module with a control circuit configured to control operations of the optical disc recording apparatus.

BRIEF DESCRIPTION OF THE DRAWINGS

A more complete appreciation of the disclosure and many of the advantages thereof are obtained as the same becomes better understood by reference to the following detailed description when considered in connection with the accompanying drawings, wherein.

DETAILED DESCRIPTION OF PREFERRED EMBODIMENTS

Figure 3:
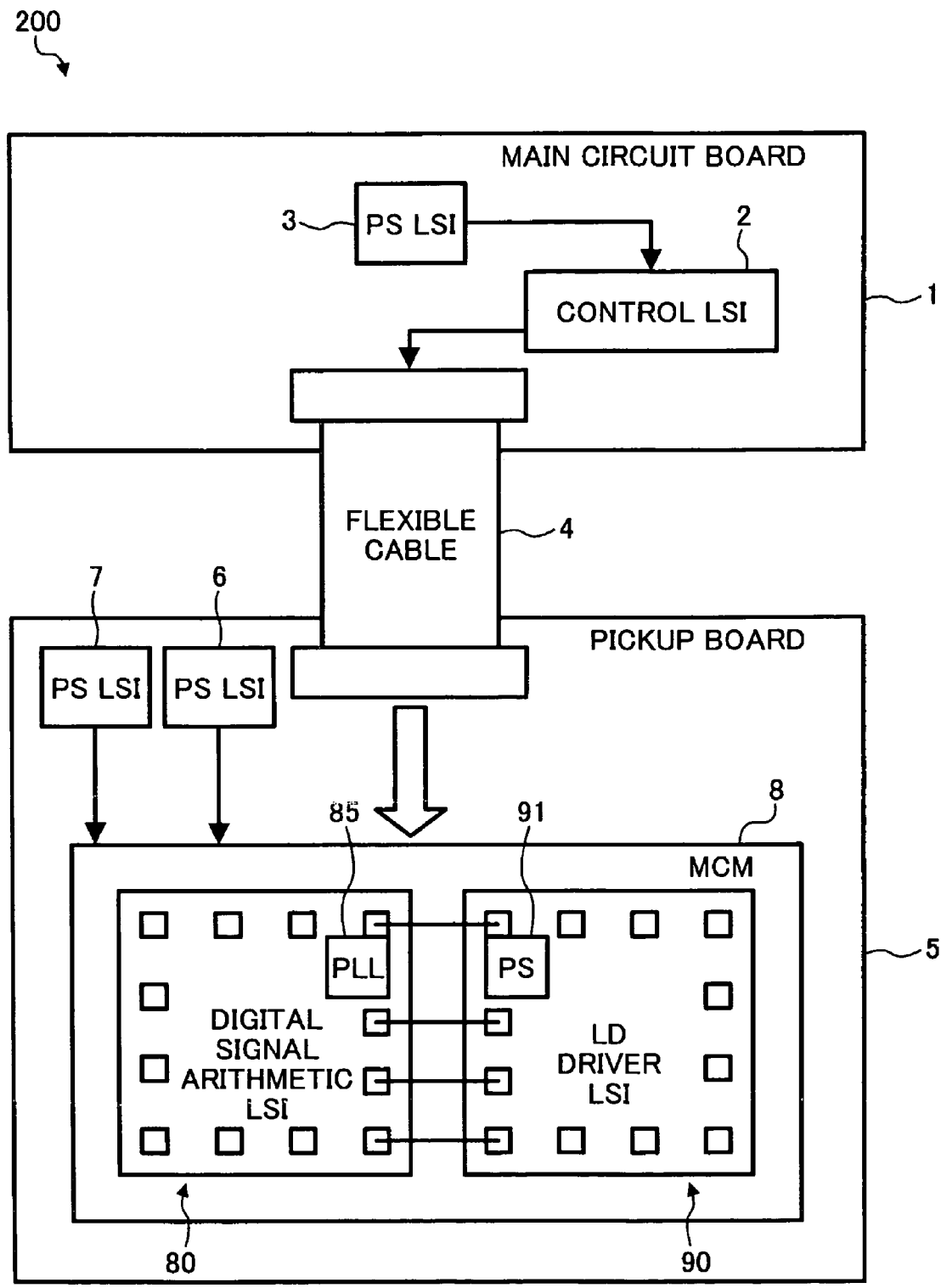
FIG. 3 is a block diagram illustrating a printed circuit board configuration of an optical disc recording apparatus using an MCM according to an embodiment of the present invention.

In describing preferred embodiments illustrated in the drawings, specific terminology is employed for the purpose of clarity. However, the disclosure of this patent specification is not intended to be limited to the specific terminology used and it is to be understood that substitutions for each specific element can include any technical equivalents that operate in a similar manner. Referring now to the drawings, wherein like reference numerals designate identical or corresponding parts throughout the several views, FIG. 3 illustrates an optical disc recording apparatus 200 according to a preferred embodiment of the present invention.

The optical disc recording apparatus 200 includes a main circuit board 1 and a pickup board 5 connected by a flexible cable 4. The main circuit board 1 includes a control LSI 2 and a PS LSI 3. The pickup board 5 includes PS LSIs 6 and 7 and an MCM 8. The MCM 8 includes a digital signal arithmetic LSI 80 including a PLL circuit 85, and an LD driver LSI 90 including a PS circuit 91.

Figure 2:
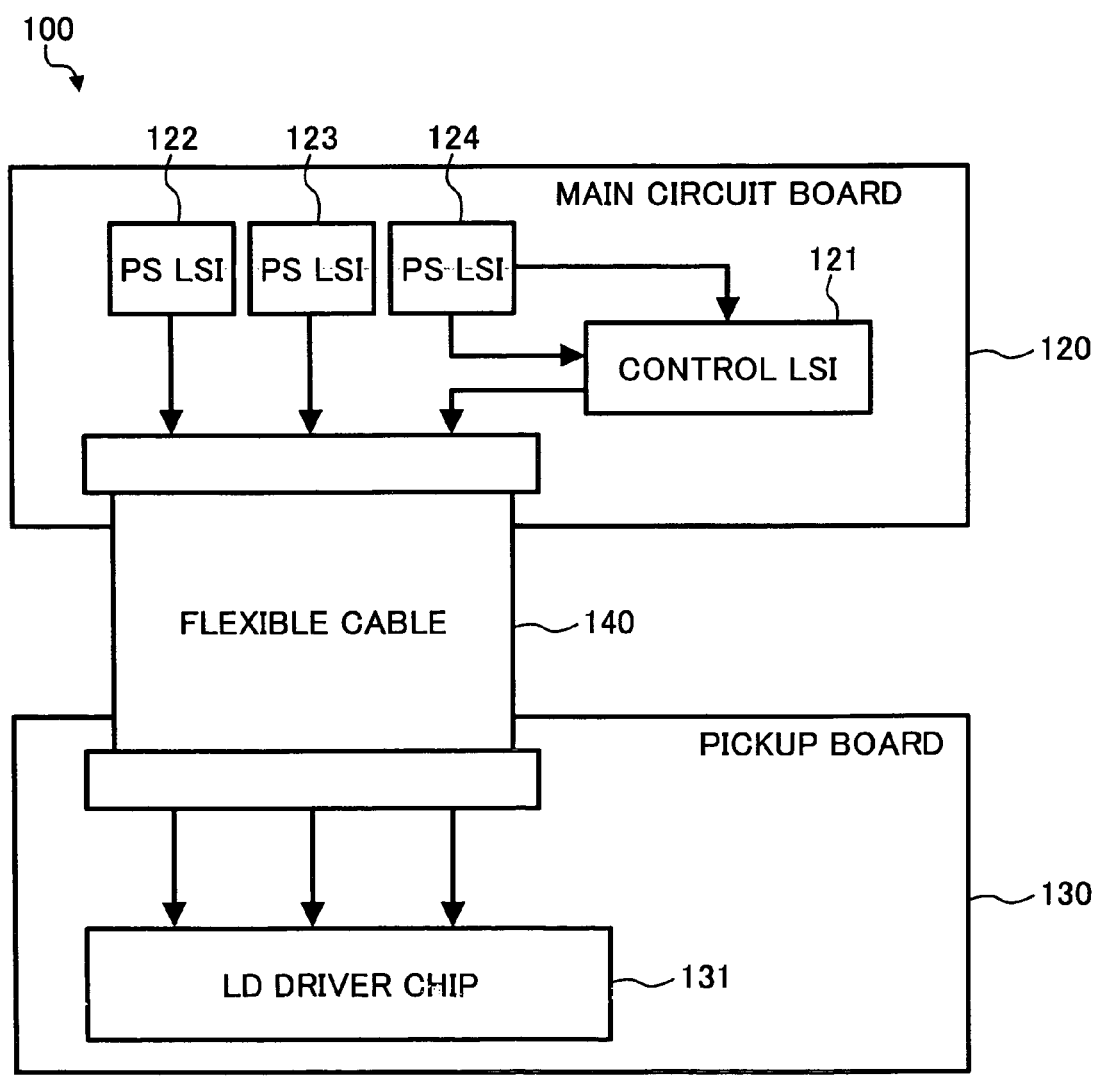
FIG. 2 is a block diagram illustrating a printed circuit board configuration of the conventional optical disc recording apparatus of FIG. 1.

Similar to the conventional optical disc recording apparatus 100 of FIG. 2, LSIs forming circuit blocks of the optical disc recording apparatus 200 are mounted on the printed circuit boards, i.e., the main circuit board 1 for controlling the system of the optical disc recording apparatus 200 and the pickup board 5 connected to the main circuit board 1 by the flexible cable 4. In FIG. 3, the main circuit board 1 is mounted with the control LSI 2 having a configuration similar to the configuration of the control LSI 121 of FIG. 2 and forming the above-described circuit blocks such as the disc controller 3, the encoder 105, the servo controller 108, the R/F circuit 109, the decoder 110, the ATIP decoder 111, the system controller 112 including a CPU, and so forth. The LSIs for forming the circuit blocks are formed by a plurality of chips but denoted by the control LSI 2 as one circuit block in FIG. 3. The main circuit board 1 is further mounted with the PS LSI 3.

The pickup board 5 is mounted with the MCM 8 including the digital signal arithmetic LSI 80 and the LD driver LSI 90, and the PS LSIs 6 and 7.

Within the MCM 8, semiconductor chips obtained through different manufacturing processes can be integrated and connected. To increase an operational speed, a drive frequency of a digital LSI is increased, and the digital LSI may be manufactured in a microfabrication process. The digital signal arithmetic LSI forming the strategy generation circuit is an integrated circuit formed through the microfabrication process. A drive voltage for the digital signal arithmetic LSI is set to be 1.8 V in the present embodiment. Also, a digital interface I/O (input/output) port (explained below) of the digital signal arithmetic LSI for interfacing the system is driven by a voltage of 3.3 V. The LD driver LSI, on the other hand, typically needs to have a drive voltage of 5 V for driving an LD diode. Further, a digital interface I/O port (explained below) of the LD driver LSI for interfacing the system is driven by a voltage of 3.3 V. The MCM can easily integrate, in one module, the LSI chips driven by different drive voltages and obtained through different manufacturing processes.

In the present embodiment, a power supply source provided in the MCM 8 supplies power to the PLL circuit 85 included in the digital signal arithmetic LSI 80. That is, based on the power supplied to the LD driver LSI 90 which is driven by a relatively high voltage, the PS circuit 91 provided within the LD driver LSI 90 supplies power to the PLL circuit 85 included in the digital signal arithmetic LSI 80.

Further, in the present embodiment, the PS LSIs 6 and 7 mounted on the pickup board 5 supply power voltages of 1.8 V and 5 V, respectively, to corresponding power supply terminals of the MCM 8.

The digital signal arithmetic LSI 80 and the LD driver LSI 90 each includes connection pads so as to be connected to each other through bonding wires. Specifically, a connection pad provided in the digital signal arithmetic LSI 80 is connected to one end of a bonding wire and a corresponding connection pad provided in the LD driver LSI 90 is connected to the other end of the bonding wire. An interface circuit for transmitting signals between the two LSIs is described below.

The PS circuit 91 included in the LD driver LSI 90 is connected to the PLL circuit 85 included in the digital signal arithmetic LSI 80 through the wiring of the printed circuit board or with the bonding wires, so that power is supplied from the PS circuit 91 to the PLL circuit 85.

Accordingly, in the present embodiment, noises attributed to the power supply wiring can be reduced, improving the oscillation accuracy of the PLL circuit 85. In this example, it is preferable to make the power supply wiring as short as possible, that is, to arrange the PS circuit 91 as close to the PLL circuit 85 as possible.

The configuration of circuitry as described above can improve a characteristic of a high-speed DVD recording LSI, e.g., the MCM 8. Further, since at least one of the plurality of power supply sources is included in the MCM, the number of power supply LSIs for the MCM to be mounted on the pickup board can be reduced. Accordingly, the size of the pickup board is reduced by the MCM technique and also by the reduction in the number of the power supply LSIs.

Figure 4:
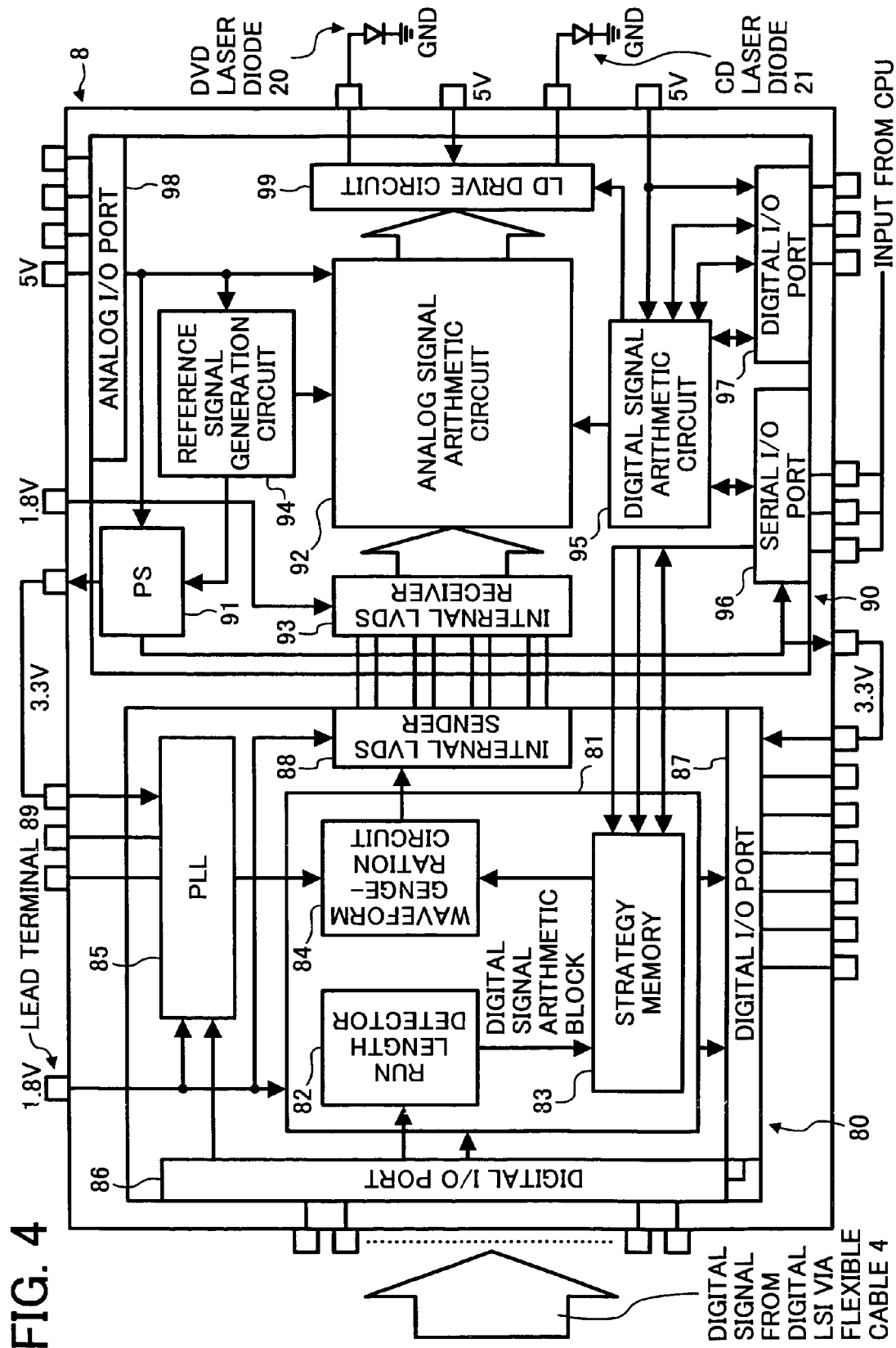
FIG. 4 is a detailed view of the MCM of FIG. 3.

FIG. 4 illustrates a detailed configuration of the MCM 8 mounted on the pickup board 5 of FIG. 3. The MCM 8 is configured to output signals to a DVD laser diode 20 and a CD laser diode 21, respectively.

In FIG. 4, the MCM 8 includes a digital signal arithmetic LSI 80, an LD driver LSI 90, and a plurality of terminals such as a lead terminal 89. The digital signal arithmetic LSI 80 includes a digital signal arithmetic block 81, a run length detector 82, a strategy memory 83, a waveform generation circuit 84, a PLL circuit 85, digital I/O ports 86 and 87, and an internal LVDS (low voltage differential signal) sender block 88. The LD driver LSI 90 includes a PS circuit 91, an analog signal arithmetic circuit 92, an internal LVDS receiver block 93, a reference signal generation circuit 94, a digital signal arithmetic circuit 95, a serial I/O port 96, a digital I/O port 97, an analog I/O port 98, and an LD drive circuit 99.

The MCM 8 includes two semiconductor chips, i.e., the digital signal arithmetic LSI 80 and the LD driver LSI 90, and each of the two LSIs includes connection pads and are connected by bonding wires, as illustrated in FIG. 3. The connection pads are not shown in FIG. 4.

The digital signal arithmetic LSI 80 forms a high-speed-operating strategy generation circuit produced through a super microfabrication process. The digital signal arithmetic LSI 80 includes the digital signal arithmetic block 81 for generating a plurality of strategy signals through a strategy generation process. The digital signal arithmetic block 81 is formed mainly by the run length detector 82, the strategy memory 83, and the waveform generation circuit 84. In the present embodiment, these circuits are supplied with a voltage of 1.8 V from the PS LSI 7 of FIG. 3 via the lead terminal 89 of the MCM 8. The digital signal arithmetic block 81 receives a digital signal (such as an EFM modulated signal, an ESM modulated signal, etc.) through the flexible cable 4 via the digital I/O port 86 from an external digital LSI forming such circuit as the encoder circuit. The digital I/O port 86 serves as a buffer unit for receiving the digital signal such as a reference clock signal, an FM modulated signal, and the ESM modulated signal, and for receiving and outputting a test signal. The digital I/O port 86 is a circuit driven by a voltage of 3.3 V.

The digital signal arithmetic block 81 detects, at the run length detector 82, the length of the digital signal input from the external digital LSI such as the EFM modulated signal and the ESM modulated signal. The digital signal arithmetic block 81 then reads out from the strategy memory 83 a strategy parameter according to the detected length of the digital signal. Then, based on the read out strategy parameter, the waveform generation circuit 84 generates a waveform signal representing timing of driving the LD to emit a laser beam from the LD, and then sends the waveform signal to the internal LVDS sender block 88. In the present embodiment, the interface circuit for transmitting signals between the digital signal arithmetic LSI 80 and the LD driver LSI 90 is formed by an LVDS circuit using differential signals. The internal LVDS sender block 88 provided in the digital signal arithmetic LSI 80 and the internal LVDS receiver block 93 provided in the LD driver LSI 90 form the LVDS circuit.

The internal LVDS sender block 88 then converts the input digital data, i.e., the waveform signals into the differential signals, and outputs the differential signals to the internal LVDS receiver block 93 of the LD driver LSI 90. The internal LVDS receiver block 93 reconverts the input differential signals to the digital signals as generated at the waveform generation circuit 84, and transmits the reconverted digital signals to the analog signal arithmetic circuit 92.

Figure 6:
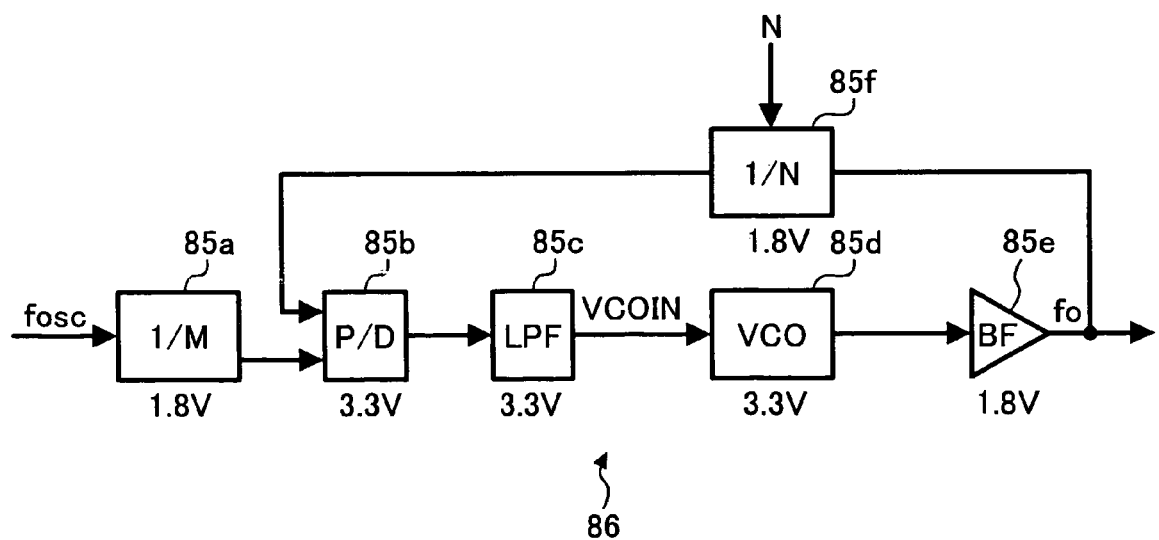
FIG. 6 is a schematic diagram of a PLL circuit used in the optical disc recording apparatus of FIG. 3.

The PLL circuit 85 includes a voltage control oscillator (VCO) 85d (see FIG. 6). The PLL circuit 85 receives the external reference clock signal. The PLL circuit 85 then supplies an internal clock signal to the waveform generation circuit 84 of the digital signal arithmetic block 81, based on a voltage of 3.3 V supplied from the PS circuit 91 (described below) of the LD driver LSI 90 and a voltage of 1.8 V which is an operation voltage for the digital signal arithmetic LSI 80.

The PS circuit 91 is a regulator circuit for receiving a voltage of 1.2 V output from the reference signal generation circuit 94. The PS circuit 91 generates a power supply voltage of 3.3 V based on a power supply voltage of 5 V, and supplies the generated power supply voltage of 3.3 V to the PLL circuit 85 via an external terminal or through the printed circuit board wiring. The PS circuit 91 further supplies power to other circuit blocks driven by the voltage of 3.3 V. Alternatively, the power may be supplied through bonding wires connected directly to the connection pads provided in the respective LSI chips.

Figure 5:
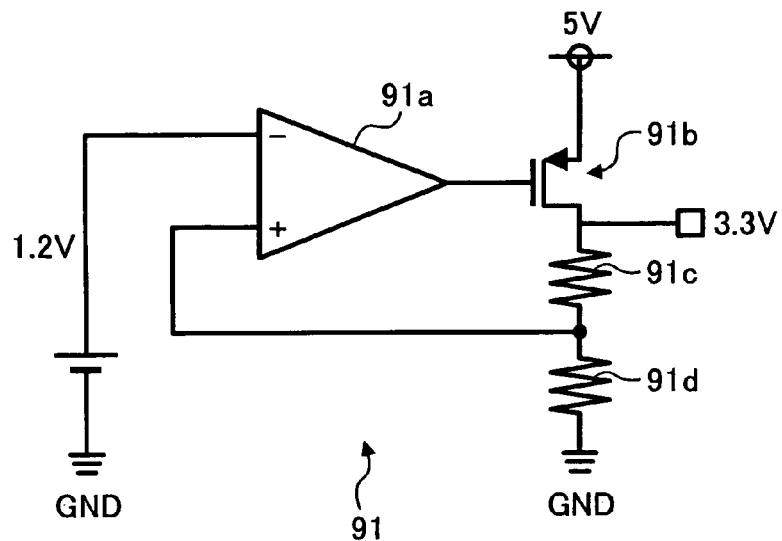
FIG. 5 is a circuit diagram illustrating a configuration of a power supply circuit used in the optical disc recording apparatus of FIG. 3.

The PS circuit 91 includes a comparator 91a, a transistor 91b, and resistors 91c and 91d, as illustrated in FIG. 5. A reference voltage of 1.2 V is input in a negative input terminal of the comparator 91a, while an output voltage divided by the resistors 91c and 91d is input through a positive input terminal of the comparator 91a. A power supply voltage of 5 V is input in one end of the transistor 91b, and a gate of the transistor 91b receives a voltage output from the comparator 91a. The other end of the transistor 91b is connected to a ground terminal (GND) via the resistors 91c and 91d. Then, a predetermined voltage of 3.3 V is output from a connection point of the transistor 91b and the resistor 91c.

In FIG. 4, the reference signal generation circuit 94 generates a reference current for a modulated current to be generated by the analog signal arithmetic circuit 92, and also generates the reference voltage to be input in the PS circuit 91.

The analog signal arithmetic circuit 92 adds the reference current received from the reference signal generation circuit 94 and a modulated current set by the digital signal arithmetic circuit 95 at the time preset by the digital signal arithmetic block 81. The analog signal arithmetic circuit 92 then generates an LD drive signal and sends the LD drive signal to the LD drive circuit 99. The LD drive circuit 99 amplifies the modulated current signal generated by the analog signal arithmetic circuit 92, and outputs a current for causing the LD to emit the laser beam.

Based on a control signal transmitted via the serial I/O port 96 from the CPU mounted on the main circuit board 1 of FIG. 3, the digital signal arithmetic circuit 95 determines the value of the modulated current and outputs the modulated current to the analog signal arithmetic circuit 92. The serial I/O port 96 serves as a buffer for transmitting signals between the CPU provided outside the MCM 8 and the integrated circuits provided in the MCM 8. The digital signal arithmetic LSI 80 and the LD driver LSI 90 connected within the MCM 8 are externally controlled through the serial I/O port 96. The digital I/O port 97 is a buffer circuit for transmitting digital signals, and the analog I/O port 98 is a buffer circuit for transmitting analog signals.

FIG. 6 illustrates an exemplary circuit configuration of the above-described PLL circuit 85. The PLL circuit 85 includes a divider circuit (1/M) 85a, a phase frequency detection circuit (P/D) 85*b*, a low-pass filter (LPF) 85*c*, a voltage-controlled oscillator (VCO) 85*d*, a buffer circuit (BF) 85*e*, and a divider circuit (1/N) 85*f*.

The external reference clock signal fosc is input in the divider circuit 85*a*, where the reference clock signal fosc is divided by a value M. The M-divided reference clock signal is then transmitted to the phase frequency detection circuit 85*b*. The phase frequency detection circuit 85*b* also receives a signal obtained by dividing an output signal f0 by a value N at the divider circuit 85*f*. The phase frequency detection circuit 85*b* compares the M-divided reference clock signal with the N-divided output signal, and outputs a signal having a voltage increased or decreased in accordance with a phase difference between the M-divided reference clock signal and the N-divided output signal. The low-pass filter 85*c* controls a level of the signal output from the phase frequency detection circuit 85*b* and sends the thus-controlled signal VCOIN to the voltage-controlled oscillator 85*d*. The voltage-controlled oscillator 85*d* controls the phase or frequency of an oscillation signal according to the signal received from the low-pass filter 85*c*. Then, the buffer circuit 85*e* outputs the output signal f0 which is fed back to the phase frequency detection circuit 85*b* via the divider circuit 85*f*. The voltage-controlled oscillator 85*d* then controls the M-divided reference clock signal and the N-divided output signal such that the two signals have an equal phase. The output signal f0 having a desired oscillation frequency can be output by adjusting the values of N and M.

Figure 7:
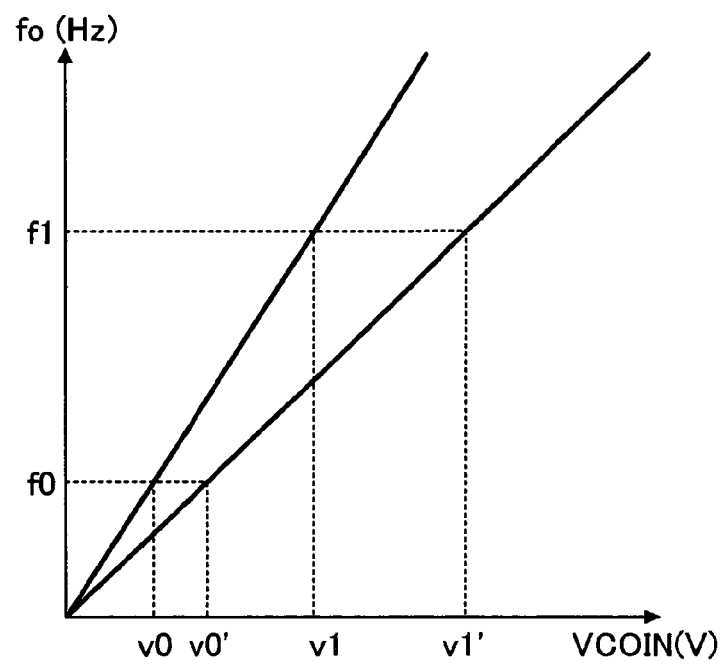
FIG. 7 is a graph illustrating a relationship between input voltage and output oscillating frequency of the PLL circuit of FIG. 6.

In the present embodiment shown in FIG. 6, the phase frequency detection circuit 85*b*, the low-pass filter 85*c*, and the voltage-controlled oscillator 85*d* are operated at the voltage of 3.3 V, while the divider circuits 85*a* and 85*f* and the buffer circuit 85*e* are operated at the voltage of 1.8 V. This voltage setting is for increasing a dynamic range of the voltage-controlled oscillator 85*d*. As is observed from the graph of FIG. 7 showing a relationship between the input voltage (VCOIN) and oscillation frequency of the output signal (fo), frequency sensitivity can be reduced by increasing a range of the input voltage, with a desired range of the oscillation frequency being fixed. As a result, a more stable output signal can be obtained. Further, it is preferable to set the value of the power supply voltage to be relatively high, since a higher power supply voltage results in a smaller ratio in a change of the input voltage VCOIN with respect to a change in value of the power supply voltage.

As described above, when the speed of data recording on the DVD is increased, the speed of transmitting signals between the two semiconductor chips, i.e., the digital signal arithmetic LSI 80 and the LD driver LSI 90 approaches a gigahertz (GHz) order. As compared with a case in which the semiconductor chips are connected by the printed circuit board wiring, the wiring for the MCM is substantially short. Even in the MCM, however, it is difficult to perform a high-speed transmission of signals due to such factors as distortion of the signals to be transmitted and a reflected wave attributed to the parasitic capacitance and resistance occurring in the wiring. In the present embodiment, therefore, the interface using the differential signals is used to transmit signals between the semiconductor chips of the digital signal arithmetic LSI 80 and the LD driver LSI 90. Specifically, to transmit signals between the digital signal arithmetic LSI 80 and the LD driver LSI 90, the LVDS circuit using the differential signals is provided, and bonding wires for connecting the semiconductor chips are used as signal lines for transmitting the differential signals. Further, the connection pads are arranged such that each of the bonding wires connecting the connection pads of the digital signal arithmetic LSI 80 with the corresponding connection pads of the LD driver LSI 90 has a uniform length.

Figure 8:
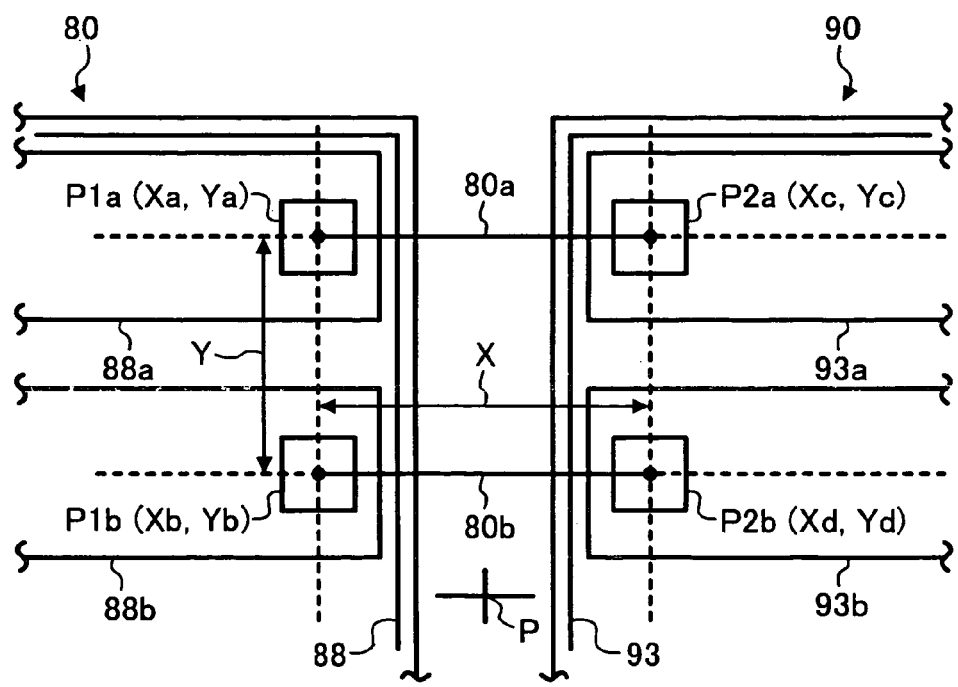
FIG. 8 is a schematic diagram illustrating a partial view of the MCM of FIG. 3 showing connection of a digital signal arithmetic LSI with an LD driver LSI.

FIG. 8 illustrates an exemplary wiring configuration, wherein the digital signal arithmetic LSI 80 and the LD driver LSI 90 are connected by bonding wires.

In FIG. 8, the digital signal arithmetic LSI 80 includes the internal LVDS sender block 88, differential signal I/O cells 88*a* and 88*b*, and connection pads P1a and P1b. The LD driver LSI 90 includes the internal LVDS receiver block 93, differential signal I/O cells 93*a* and 93*b*, and connection pads P2*a* and P2*b*. The internal LVDS sender block 88 is connected to the internal LVDS receiver block 93 through bonding wires 80*a* and 80*b*.

As described above, the interface circuit for transmitting the signals between the digital signal arithmetic LSI 80 and the LD driver LSI 90 is formed by the LVDS circuit using the differential signals. The LVDS circuit is formed by the internal LVDS sender block 88 provided in the digital signal arithmetic LSI 80 and the internal LVDS receiver block 93 provided in the LD driver LSI 90.

FIG. 8 illustrates a pair of signal lines connecting the internal LVDS sender block 88 and the internal LVDS receiver block 93, as an example, although the internal LVDS sender block 88 and the internal LVDS receiver block 93 are actually connected by (2×n) number of signal lines. The internal LVDS sender block 88 generates an inverted signal by inverting a signal level of a signal input in the internal LVDS sender block 88. Based on the inverted signal, the internal LVDS sender block 88 generates and outputs a pair of differential signals. The pair of differential signals is then input in the internal LVDS receiver block 93, which compares the two differential signals to detect a difference in voltage between the differential signals. The internal LVDS receiver block 93 then generates a signal having a signal level according to a result of the detection, and reconstructs the signal as input in the internal LVDS sender block 88. To effectively perform this operation, it is preferable to eliminate as much skew as possible between a pair of the signal lines 80*a* and 80*b* used for connecting the internal LVDS sender block 88 and the internal LVDS receiver block 93. It is, therefore, preferable to connect the digital signal arithmetic LSI 80 and the LD driver LSI 90 according to equal-length wiring described below.

As illustrated in FIG. 8, in the internal LVDS sender block 88 of the digital signal arithmetic LSI 80, the connection pad P1*a* is mounted on the differential signal I/O cell 88*a*, and the connection pad P1*b* is mounted on the differential signal I/O cell 88*b*. Similarly, in the internal LVDS receiver block 93 of the LD driver LSI 90, the connection pad P2*a* is mounted on the differential signal I/O cell 93*a*, and the connection pad P2*b* is mounted on the differential signal I/O cell 93*b*. Further, the connection pad P1*a* of the digital signal arithmetic LSI 80 is connected to the connection pad P2*a* of the LD driver LSI 90 through the bonding wire 80*a* serving as a signal line. Similarly, the connection pad P1*b* of the digital signal arithmetic LSI 80 is connected to the connection pad P2*b* of the LD driver LSI 90 through the bonding wire 80*b* serving as another signal line.

In FIG. 8, the connection pads P1*a* and P1*b* of the digital signal arithmetic LSI 80 and the connection pads P2*a* and P2*b* of the LD driver LSI 90 are configured such that a coordinate of each of the connection pads is determined such that the horizontal axes indicated by broken lines becomes parallel to one another and the vertical axes indicated by broken lines becomes parallel to one another.

It is now assumed that the coordinate of the connection pad P1*a* is (Xa, Ya), the coordinate of the connection pad P1*b* is (Xb, Yb), the coordinate of the connection pad P2a is (Xc, Yc), and the coordinate of the connection pad P2b is (Xd, Yd). P indicates an assembly reference coordinate point in the MCM 8.

In FIG. 8, the connection pads P1a, P1b, P2a, and P2b are arranged such that |Ya−Yc| and |Yb−Yd| which are absolute values in the vertical direction indicated by arrows Y become equal, and that |Xa−Xc| and |Xb−Xd| which are absolute values in the horizontal direction indicated by arrows X become equal, with respect to the assembly reference coordinate point P. With the connection pads thus arranged, it is possible to implement the equal-length wiring such that a distance between the connection pads P1a and P2a becomes equal to a distance between the connection pads P1b and P2b, even without using any special assembling device in a manufacturing process of the MCM. The equal-length wiring can minimize the skew occurring among the differential signals, allowing accurate, high-speed signal transmission.

Figure 9:
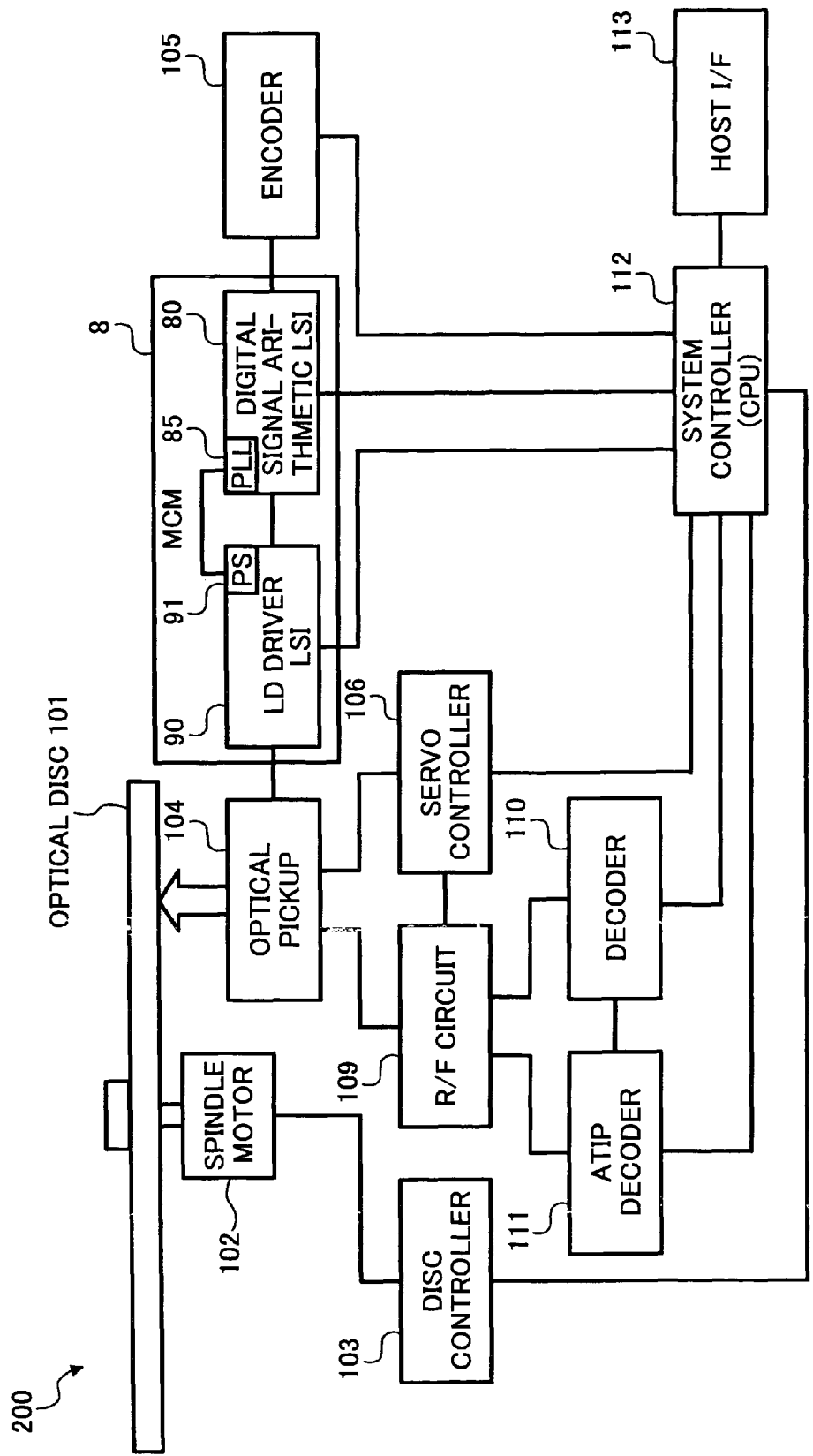
FIG. 9 is a block diagram illustrating a system configuration of the optical disc recording apparatus of FIG. 3.

Referring to FIG. 9, an exemplary operation of the optical disc recording apparatus 200 using the MCM 8 is described below.

Figure 1:
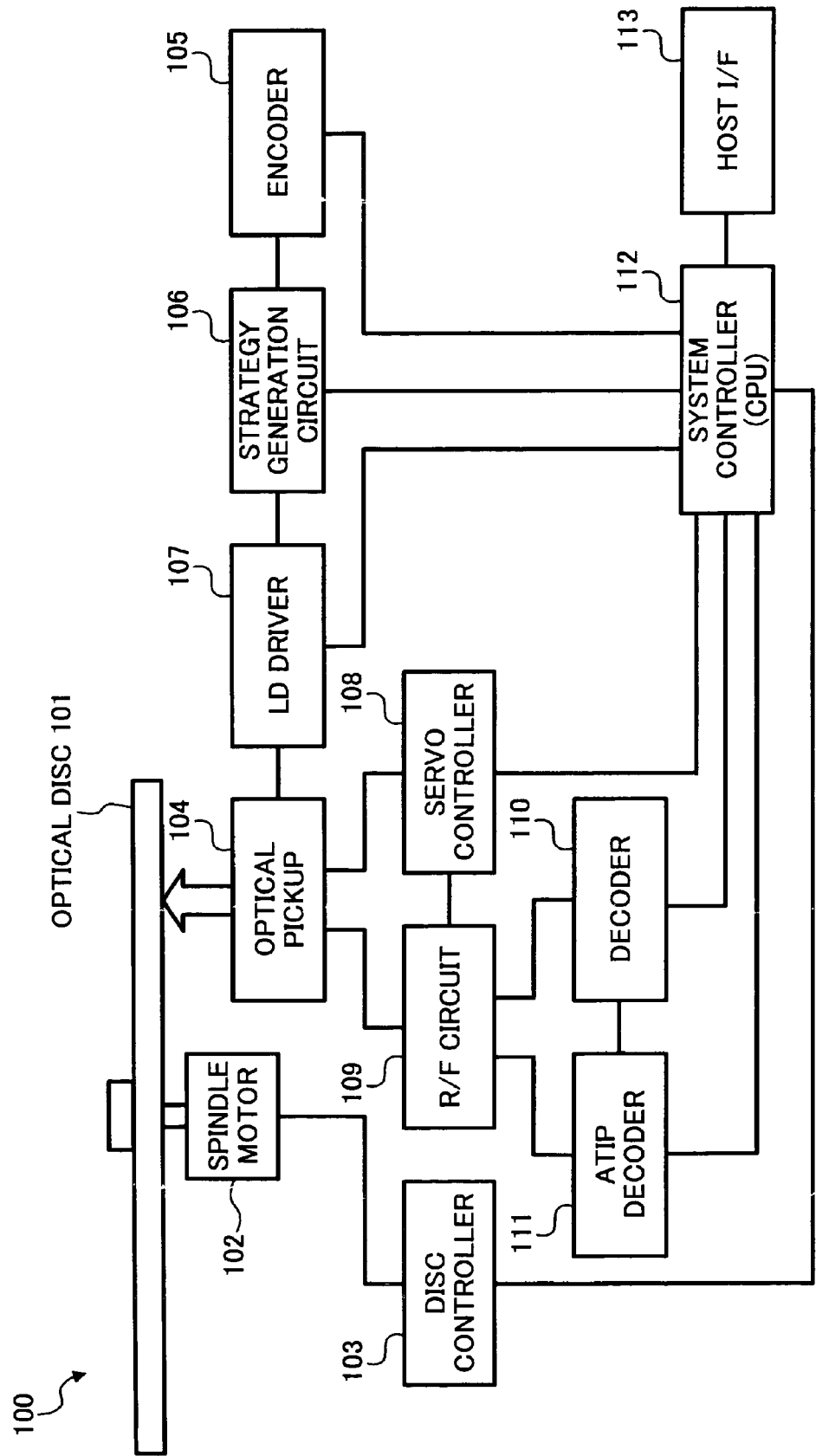
FIG. 1 is a block diagram illustrating a system configuration of a conventional optical disc recording apparatus.

The optical disc recording apparatus 200 of FIG. 9 is similar in system configuration to the conventional optical disc recording apparatus 100 of FIG. 1 except that the MCM 8 replaces the strategy generation circuit 106 and the LD driver 107. Therefore, description of components in the optical disc recording apparatus 200 which are used also in the optical disc recording apparatus 100 are omitted.

In the optical disc recording apparatus 200, the optical disc 101 is rotated by the spindle motor 102. The disc controller 103 controls drive of the spindle motor 102 such that the liner velocity becomes constant at any radial position of the track of the optical disc 101. Accordingly, the spindle motor 102 rotates the optical disc 101 at a constant speed. Further, the disc controller 103 controls the spindle motor 102 such that the spindle motor 102 controls rotation of the optical disc 101 by the PLL method, wherein the optical disc 101 is rotated at a predetermined speed, e.g., the normal speed, the 2×-speed, the 4×-speed, the 8×-speed, the 12×-speed, the 16×-speed, the 32×-speed, etc.

The optical pickup 104 includes the semiconductor laser, the optical system, the photo-detector, and so forth (not shown) for focusing and applying a laser beam to the optical disc 101 to perform data recording or data reproduction.

The circuit blocks forming the system of the optical disc recording apparatus 200 are mounted on either one of the main circuit board 1 and the pickup board 5 connected to the main circuit board 1 by the flexible cable 4, as illustrated in FIG. 3. The main circuit board 1 is mounted with the control LSI 2 for forming, for example, the disc controller 103, the encoder 105, the servo controller 108, the R/F circuit 109, the decoder 110, the ATIP decoder 111, and the system controller 112.

Meanwhile, the pickup board 5 is mounted with the MCM 8 which includes the digital signal arithmetic LSI 80 and the LD driver LSI 90, to form the strategy generation circuit according to the present invention. Further, the MCM 8 is configured such that the PS circuit 91 provided in the LD driver LSI 90 supplies power to the PLL circuit 85 provided in the digital signal arithmetic LSI 80.

The servo controller 108 controls focusing and tracking of the laser beam emitted from the semiconductor laser of the optical pickup 104. The R/F circuit 109 performs a predetermined operation on the waveform of the reproduced signal transmitted from the optical pickup 104 and binarizes a resultant signal to generate an R/F signal. The decoder 110 demodulates the R/F signal by the EFM demodulation or the ESM demodulation to generate demodulated data, and performs data processing such as the error correction and the deinterleaving. At the ATIP decoder 111, noise components are eliminated from the TE signal by the band-pass filter (not shown), and the TE signal is digitalized by the binarization circuit (not shown), and demodulated by the FSK demodulation circuit (not shown), so that the wobble signal is generated. The disc controller 103 controls the rotation of the optical disc 101 such that the wobble signal takes a predetermined value.

The data to be recorded on the optical disc 101 is input from the external apparatus via the host I/F 113 in the encoder 105. The data thus input is subjected to predetermined processing such as the interleaving and the error check coding and then to the EFM modulation or the ESM modulation, so that the digital signal arithmetic LSI 80 forming the strategy generation circuit of the MCM 8 generates a write pulse having a predetermined pulse length in consideration of a write strategy parameter. During the data recording operation, the ATER is checked at regular time intervals. If it is determined that the ATER has exceeded a predetermined value, the width of the write pulse is reduced to be slightly shorter than the pulse width usually used. To obtain the original pit length, a write power is increased immediately before falling of the write pulse to compensate for the reduced width of the write pulse. The write pulse is then input in the LD driver LSI 90 to generate a drive current according to a length of the pit to be formed on the recording surface of the optical disc 101. The drive current is input in the optical pickup 104 to drive the semiconductor laser, and the laser beam emitted from the semiconductor laser is focused by the optical system to form the beam spot on the recording surface of the optical disc 101 rotating at the constant speed. Accordingly, a pit having a predetermined length is formed on the recording surface.

Figure 10:
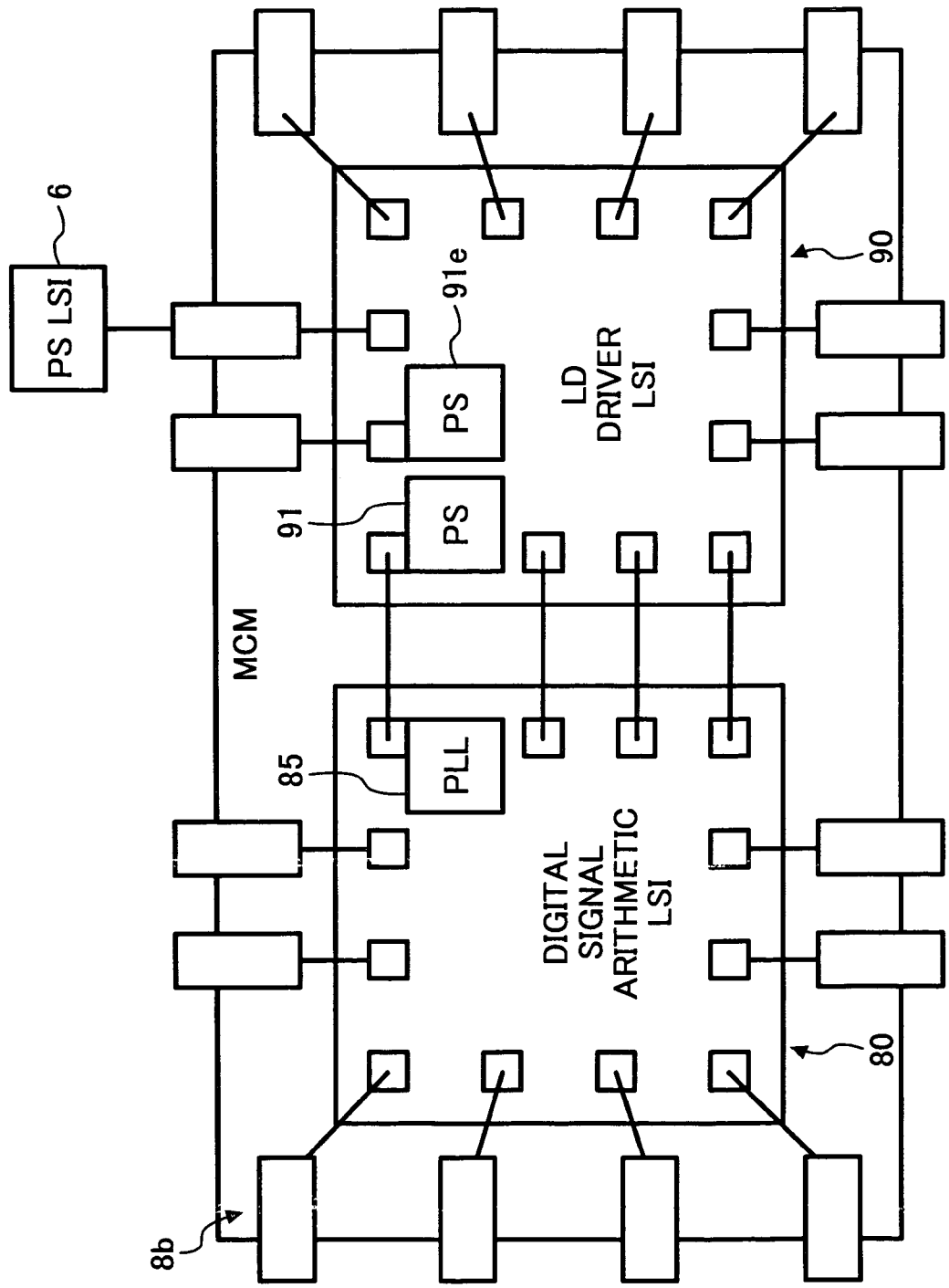
FIG. 10 is a block diagram illustrating a configuration of an MCM according to another embodiment of the present invention.

Another embodiment of the present invention is illustrated in FIG. 10. FIG. 10 is a schematic view of an exemplary configuration of an MCM according to the another embodiment of the present invention. The MCM 8b of FIG. 10 is similar in configuration to the MCM 8 of FIG. 3 except that the LD driver LSI 90 includes a PS circuit 91e, as well as the PS circuit 91. Therefore, description of the components used also in the MCM 8 of FIG. 3 are omitted.

In the MCM 8 of FIG. 3, the PS circuit 91, which is the 3.3 V power supply circuit, is included in the LD driver LSI 90, while the PS LSI 6, which is the 5 V power supply circuit, and the PS LSI 7, which is the 1.8 V power supply circuit, are mounted outside the MCM 8 on the printed circuit board 5.

On the other hand, in the MCM 8b of FIG. 10, the PS circuit 91e, which is a 1.8 V power supply circuit, is included in the LD driver LSI 90. With the MCM 8b thus configured, the number of PS LSIs to be provided outside the MCM 8b is reduced to one. That is, only the PS LSI 6 is provided outside the MCM 8b.

Although the above-described embodiments use the power supply circuits of the voltages of 1.8 V, 3.3 V, and 5 V, respectively, the values of the power supply voltages are not limited to the above three, but may be differently set.

Further, in the above-described embodiments, the digital signal arithmetic LSI 80 and the LD driver LSI 90 are fabricated in different manufacturing processes, and then incorporated into one MCM. If the manufacturing process is modified to integrate the high-voltage driven LD driver unit and the low-voltage driven digital signal arithmetic unit into one chip, wherein the power supply circuit is provided in the high-voltage driven unit for supplying power to the PLL circuit provided in the low-voltage driven digital signal arithmetic unit, effects of the above-described embodiments can be obtained.

Furthermore, in the above-described embodiments, the power voltage of 3.3 V generated in the PS circuit 91 is supplied to the PLL circuit 85. In the modified manufacturing process for incorporating the high-voltage driven LD driver unit and the low-voltage driven digital signal arithmetic unit into one chip, the power voltage of 5 V may be generated in the reference signal generation circuit 94 and supplied to the PLL circuit 85.

Numerous additional modifications and variations are possible in light of the above teachings. It is therefore to be understood that within the scope of the appended claims, the disclosure of this patent specification may be practiced otherwise than as specifically described herein.

This patent specification is based on Japanese patent application No. 2003-426256 filed on Dec. 24, 2003 in the Japan Patent Office, the entire contents of which are incorporated by reference herein.

What is claimed is:

1. An optical disc recording apparatus for recording external data on an optical disc by using a semiconductor laser, comprising:
    a circuit board;
    a power supply source configured to be mounted on the circuit board to output at least one power voltage including a first voltage; and
    a multi chip module configured to be mounted on the circuit board to receive the at least one power voltage including the first voltage output from the power supply source, the multi chip module comprising:
        a first circuit configured to include at least one power supply circuit configured to generate at least one power voltage including a second voltage; and
        a second circuit configured to receive the at least one power voltage including the second voltage output from the at least one power supply circuit of the first circuit.

2. The optical disc recording apparatus as described in claim 1, wherein the second voltage is lower than the first voltage, and
    wherein the first circuit is driven by the first voltage, and the second circuit is driven by the second voltage.

3. The optical disc recording apparatus as described in claim 1, wherein the second circuit performs a digital signal arithmetic operation based on the external data encoded in a predetermined manner to generate a plurality of strategy signals through a strategy generation process based on the encoded external data, and
    wherein the first circuit controls driving of the semiconductor laser to emit a laser beam to the optical disc based on the plurality of strategy signals.

4. The optical disc recording apparatus as described in claim 1, wherein the second circuit comprises a phase locked loop circuit configured to receive the second voltage output from the at least one power supply circuit of the first circuit.

5. The optical disc recording apparatus as described in claim 1, wherein the first and second circuits are formed by separate semiconductor chips.

6. The optical disc recording apparatus as described in claim 3, wherein the first circuit comprises a first interface circuit and the second circuit comprises a second interface circuit,
    wherein the second interface circuit converts the plurality of strategy signals to a plurality of low voltage differential signals to transmit the plurality of low voltage differential signals to the first interface circuit, and
    wherein the first interface circuit reconverts the plurality of low voltage differential signals to the plurality of strategy signals.

7. The optical disc recording apparatus as described in claim 6, wherein the first interface circuit comprises connection pads and the second interface circuit comprises respectively corresponding connection pads, and
    wherein the connection pads in the first interface circuit are connected to the respectively corresponding connection pads in the second interface circuit at a substantially equal distance through bonding wires of a substantially equal length to transmit the plurality of low voltage differential signals from the second interface circuit to the first interface circuit.

8. The optical disc recording apparatus as described in claim 1, wherein the at least one power voltage including the first voltage output from the power supply source also includes a third voltage, and
    wherein the first voltage is about 5 volts, the second voltage is about 3.3 volts, and the third voltage is about 1.8 volts.

9. The optical disc recording apparatus as described in claim 1, wherein the at least one power voltage including the second voltage output from the at least one power supply circuit of the first circuit also includes a third voltage, and
    wherein the first voltage is about 5 volts, the second voltage is about 3.3 volts, and the third voltage is about 1.8 volts.

10. The optical disc recording apparatus as described in claim 1, further comprising:
    another circuit board comprising a control circuit configured to control operations of the optical disc recording apparatus; and
    a signal cable configured to interface the control circuit with the multi chip module.

11. An optical disc recording apparatus for recording external data on an optical disc by using a semiconductor laser, comprising:
    a circuit board;
    power supplying means for outputting at least one power voltage including a first voltage and mounted on the circuit board; and
    a multi chip module configured to be mounted on the circuit board to receive the at least one power voltage including the first voltage output from the power supplying means, the multi chip module comprising:
        first circuit means for controlling driving of the semiconductor laser to emit a laser beam to the optical disc, and generating at least one power voltage including a second voltage; and
        second circuit means for receiving the at least one power voltage including the second voltage output from the first circuit means, and performing a digital signal arithmetic operation based on the external data encoded in a predetermined manner to generate a plurality of strategy signals through a strategy generation process based on the encoded external data,
    wherein the first circuit means controls the driving of the semiconductor laser based on the plurality of strategy signals.

12. The optical disc recording apparatus as described in claim 11, wherein the second voltage is lower than the first voltage, and
    wherein the first circuit means is driven by the first voltage, and the second circuit means is driven by the second voltage.

13. The optical disc recording apparatus as described in claim 11, wherein the second circuit means performs a phase locked loop operation based on the second voltage.

14. The optical disc recording apparatus as described in claim 11, wherein the first and second circuit means are formed by separate semiconductor chips.

15. The optical disc recording apparatus as described in claim 11, wherein the second circuit means converts the plurality of strategy signals to a plurality of low voltage differential signals to transmit the plurality of low voltage differential signals to the first circuit means, and wherein the first circuit means reconverts the plurality of low voltage differential signals to the plurality of strategy signals.

16. The optical disc recording apparatus as described in claim 15, wherein the first circuit means is formed by a first semiconductor chip and the second circuit means is formed by a second semiconductor chip, wherein the first semiconductor chip comprises connection pads and the second semiconductor chip comprises respectively corresponding connection pads, and wherein the connection pads in the first semiconductor chip are connected to the respectively corresponding connection pads in the second semiconductor chip at a substantially equal distance through bonding wires of a substantially equal length to transmit the plurality of low voltage differential signals from the second semiconductor chip to the first semiconductor chip.

17. The optical disc recording apparatus as described in claim 11, wherein the at least one power voltage including the first voltage output from the power supplying means also includes a third voltage, and wherein the first voltage is about 5 volts, the second voltage is about 3.3 volts, and the third voltage is about 1.8 volts.

18. The optical disc recording apparatus as described in claim 11, wherein the at least one power voltage including the second voltage output from the first circuit means also includes a third voltage, and wherein the first voltage is about 5 volts, the second voltage is about 3.3 volts, and the third voltage is about 1.8 volts.

19. The optical disc recording apparatus as described in claim 11, further comprising:

another circuit board;

controlling means for controlling operations of the optical disc recording apparatus, the controlling means being mounted on the another circuit board; and interfacing means for interfacing the controlling means with the multi chip module.

20. An optical disc recording method of recording external data on an optical disc by using a semiconductor laser, comprising:

providing a circuit board;

mounting on the circuit board a power supply source configured to output at least one power voltage including a first voltage;

placing on the circuit board a multi chip module integrating a first circuit configured to receive the first voltage and separately generate at least one power voltage including a second voltage with a second circuit configured to receive the at least one power voltage including the second voltage output from the first circuit;

causing the second circuit to perform a digital signal arithmetic operation based on the external data encoded in a predetermined manner to generate a plurality of strategy signals through a strategy generation process based on the encoded external data; and causing the first circuit to control driving of the semiconductor laser based on the plurality of strategy signals to emit a laser beam and record the external data on the optical disc.

21. The method as described in claim 20, further comprising:

driving the first circuit by the first voltage; and driving the second circuit by the second voltage, wherein the second voltage is lower than the first voltage.

22. The method as described in claim 20, further comprising:

causing the second circuit to perform a phase locked loop operation based on the second voltage.

23. The method as described in claim 20, wherein the first and second circuits are formed by separate semiconductor chips.

24. The method as described in claim 20, further comprising:

causing the second circuit to convert the plurality of strategy signals to a plurality of low voltage differential signals;

transmitting the plurality of low voltage differential signals from the second circuit to the first circuit; and causing the first circuit to reconvert the plurality of low voltage differential signals to the plurality of strategy signals.

25. The method as described in claim 24, wherein the first circuit is formed by a first semiconductor chip and the second circuit is formed by a second semiconductor chip, wherein the first semiconductor chip comprises connection pads and the second semiconductor chip comprises respectively corresponding connection pads, and wherein the connection pads in the first semiconductor chip are connected to the respectively corresponding connection pads in the second semiconductor chip at a substantially equal distance through bonding wires of a substantially equal length to transmit the plurality of low voltage differential signals from the second semiconductor chip to the first semiconductor chip.

26. The method as described in claim 20, wherein the at least one power voltage including the first voltage output from the power supply source also includes a third voltage, and wherein the first voltage is about 5 volts, the second voltage is about 3.3 volts, and the third voltage is about 1.8 volts.

27. The method as described in claim 20, wherein the at least one power voltage including the second voltage output from the first circuit also includes a third voltage, and wherein the first voltage is about 5 volts, the second voltage is about 3.3 , and the third voltage is about 1.8 volts.

28. The method as described in claim 20, further comprising:

providing another circuit board;

mounting on the another circuit board a control circuit configured to control operations of the optical disc recording apparatus; and interfacing the control circuit with the multi chip module through a signal cable.

29. A multi chip module for an optical disc recording apparatus recording external data on an optical disc by using a semiconductor laser, the multi chip module comprising:

a first circuit configured to receive a first voltage included in at least one power voltage output from an external power supply source and include at least one power supply circuit configured to generate at least one power voltage including a second voltage; and a second circuit configured to receive the at least one power voltage including the second voltage output from the at least one power supply circuit of the first circuit, wherein the second voltage is lower than the first voltage, and wherein the first circuit is driven by the first voltage, and the second circuit is driven by the second voltage.

30. The multi chip module as described in claim 29, wherein the second circuit performs a digital signal arithmetic operation based on the external data encoded in a predetermined manner to generate a plurality of strategy signals through a strategy generation process based on the encoded external data, and wherein the first circuit controls driving of the semiconductor laser to emit a laser beam to the optical disc based on the plurality of strategy signals.

31. The multi chip module as described in claim 29, wherein the second circuit comprises a phase locked loop circuit configured to receive the second voltage output from the at least one power supply circuit of the first circuit.

32. The multi chip module as described in claim 29, wherein the first and second circuits are formed by separate semiconductor chips.

33. The multi chip module as described in claim 30, wherein the first circuit comprises a first interface circuit and the second circuit comprises a second interface circuit, wherein the second interface circuit converts the plurality of strategy signals to a plurality of low voltage differential signals to transmit the plurality of low voltage differential signals to the first interface circuit, and wherein the first interface circuit reconverts the plurality of low voltage differential signals to the plurality of strategy signals.

34. The multi chip module as described in claim 33, wherein the first circuit is formed by a first semiconductor chip and the second circuit is formed by a second semiconductor chip, wherein the first semiconductor chip comprises connection pads and the second semiconductor chip comprises respectively corresponding connection pads, and wherein the connection pads in the first semiconductor chip are connected to the respectively corresponding connection pads in the second semiconductor chip at a substantially equal distance through bonding wires of a substantially equal length to transmit the plurality of low voltage differential signals from the second semiconductor chip to the first semiconductor chip.

35. The multi chip module as described in claim 29, wherein the at least one power voltage including the first voltage output from the external power supply source also includes a third voltage, and wherein the first voltage is about 5 volts, the second voltage is about 3.3 , and the third voltage is about 1.8 volts.

36. The multi chip module as described in claim 29, wherein the at least one power voltage including the second voltage output from the at least one power supply circuit of the first circuit also includes a third voltage, and wherein the first voltage is about 5 volts, the second voltage is about 3.3 , and the third voltage is about 1.8 volts.

37. The multi chip module as described in claim 29, wherein the multi chip module receives the external data through a signal cable from a control circuit of the optical disc recording apparatus.

38. A multi chip module for an optical disc recording apparatus which records external data on an optical disc by using a semiconductor laser, the multi chip module comprising:

first circuit means for receiving at least one power voltage including a first voltage output from an external power supply source, and separately generating at least one power voltage including a second voltage; and second circuit means for receiving the at least one power voltage including the second voltage output from the first circuit means, wherein the second voltage is lower than the first voltage, and wherein the first circuit means is driven by the first voltage, and the second circuit means is driven by the second voltage.

39. The multi chip module as described in claim 38, wherein the second circuit means performs a digital signal arithmetic operation based on the external data encoded in a predetermined manner to generate a plurality of strategy signals through a strategy generation process based on the encoded external data, and wherein the first circuit means controls driving of the semiconductor laser to emit a laser beam to the optical disc based on the plurality of strategy signals.

40. The multi chip module as described in claim 38, wherein the second circuit means performs a phase locked loop operation based on the second voltage.

41. The multi chip module as described in claim 38, wherein the first and second circuit means are formed by separate semiconductor chips.

42. The multi chip module as described in claim 39, wherein the second circuit means converts the plurality of strategy signals to a plurality of low voltage differential signals to transmit the plurality of low voltage differential signals to the first circuit means, and wherein the first circuit means reconverts the plurality of low voltage differential signals to the plurality of strategy signals.

43. The multi chip module as described in claim 42, wherein the first circuit means is formed by a first semiconductor chip and the second circuit means is formed by a second semiconductor chip, wherein the first semiconductor chip comprises connection pads and the second semiconductor chip comprises respectively corresponding connection pads, and wherein the connection pads in the first semiconductor chip are connected to the respectively corresponding connection pads in the second semiconductor chip at a substantially equal distance through bonding wires of a substantially equal length to transmit the plurality of low voltage differential signals from the second semiconductor chip to the first semiconductor chip.

44. The multi chip module as described in claim 39, wherein the at least one power voltage including the first voltage output from the external power supply source also includes a third voltage, and wherein the first voltage is about 5 volts, the second voltage is about 3.3 , and the third voltage is about 1.8 volts.

45. The multi chip module as described in claim 38, wherein the at least one power voltage including the second voltage output from the first circuit means also includes a third voltage, and wherein the first voltage is about 5 volts, the second voltage is about 3.3 , and the third voltage is about 1.8 volts.

46. The multi chip module as described in claim 38, wherein the multi chip module receives the external data through a signal cable from a control circuit of the optical disc recording apparatus.

47. A method of controlling driving of a semiconductor laser used in an optical disc recording apparatus recording external data on an optical disc, the method comprising:
    providing a multi chip module comprising:
        a first circuit configured to receive a first voltage included in at least one power voltage output from an external power supply source and separately generate at least one power voltage including a second voltage, the second voltage being lower than the first voltage; and
        a second circuit configured to receive the at least one power voltage including the second voltage output from the first circuit,
    driving the first circuit by the first voltage; and
    driving the second circuit by the second voltage.

48. The method as described in claim 47, further comprising:
    causing the second circuit to perform a digital signal arithmetic operation based on the external data encoded in a predetermined manner to generate a plurality of strategy signals through a strategy generation process based on the encoded external data; and
    causing the first circuit to control driving of the semiconductor laser to emit a laser beam to the optical disc based on the plurality of strategy signals.

49. The method as described in claim 47, further comprising:
    causing the second circuit to perform a phase locked loop operation based on the second voltage.

50. The method as described in claim 47, wherein the first and second circuits are formed by separate semiconductor chips.

51. The method as described in claim 48, further comprising:
    causing the second circuit to convert the plurality of strategy signals to a plurality of low voltage differential signals;
    transmitting the plurality of low voltage differential signals from the second circuit to the first circuit; and
    causing the first circuit to reconvert the plurality of low voltage differential signals to the plurality of strategy signals.

52. The method as described in claim 51, wherein the first circuit is formed by a first semiconductor chip and the second circuit is formed by a second semiconductor chip,
    wherein the first semiconductor chip comprises connection pads and the second semiconductor chip comprises respectively corresponding connection pads, and
    wherein the connection pads in the first semiconductor chip are connected to the respectively corresponding connection pads in the second semiconductor chip at a substantially equal distance through bonding wires of a substantially equal length to transmit the plurality of low voltage differential signals from the second semiconductor chip to the first semiconductor chip.

53. The method as described in claim 47, wherein
    the at least one power voltage including the first voltage output from the external power supply source also includes a third voltage, and
    wherein the first voltage is about 5 volts, the second voltage is about 3.3 , and the third voltage is about 1.8 volts.

54. The method as described in claim 47, wherein the at least one power voltage including the second voltage output from the first circuit also includes a third voltage, and
    wherein the first voltage is about 5 volts, the second voltage is about 3.3 , and the third voltage is about 1.8 volts.

55. The method as described in claim 47, further comprising:
    interfacing, through a signal cable, the multi chip module with a control circuit configured to control operations of the optical disc recording apparatus.

* * * * *